United States Patent [19]

Seta et al.

[11] Patent Number: 5,258,957
[45] Date of Patent: Nov. 2, 1993

[54] SEMICONDUCTOR MEMORY DEVICE

[75] Inventors: Katsuhiro Seta, Tokyo; Hiroyuki Hara, Fujisawa; Takayasu Sakurai, Tokyo; Yoshinori Watanabe, Yokohama, all of Japan

[73] Assignee: Kabushiki Kaisha Toshiba, Kawasaki, Japan

[21] Appl. No.: 849,458

[22] Filed: Mar. 11, 1992

[30] Foreign Application Priority Data

Mar. 14, 1991 [JP] Japan .................................. 3-049673

[51] Int. Cl.$^5$ .............................................. G11C 13/00
[52] U.S. Cl. .................................. 365/207; 365/189.01
[58] Field of Search ........... 365/207, 182, 185, 189.01, 365/189.08, 230.01, 230.06

[56] References Cited

U.S. PATENT DOCUMENTS 4,618,945 10/1986 Sakurai et al. .................... 365/189
5,148,395 9/1992 Sowards .............................. 365/207

OTHER PUBLICATIONS

T. S. Yang et al., "A 4nsec 4kx1bit Two-Port BiCMOS SRAM", IEEE 1988 CCIC, 4.7.1-4.7.4.

*Primary Examiner*—Terrell W. Fears
*Attorney, Agent, or Firm*—Banner, Birch, McKie & Beckett

[57] ABSTRACT

In a semiconductor memory device of a divided bit line system, read signals from memory cell blocks are sense-amplified together by a single differential bit line sense amplifier. The bit line sense amplifier includes a plurality of first transistors, the base electrodes of which are connected to local bit lines of the memory cell blocks, the emitter electrodes of which are commonly connected to corresponding main bit lines, and the collector electrodes of which are connected to a first power supply node, a second transistor, which forms a differential pair with each of the first transistors, the base electrode of which is applied with a reference bias potential, and the emitter electrode of which is connected to the main bit lines, a current source connected between the emitter electrode of the second transistor, and a second power supply node, and a load circuit connected between the collector electrode of the second transistor and the first power supply node. The main bit lines with a heavy load can be driven by the emitters having a large driving force, and the outputs from the memory cell blocks can be sensed without going through selectors, thus attaining high-speed read access.

10 Claims, 5 Drawing Sheets

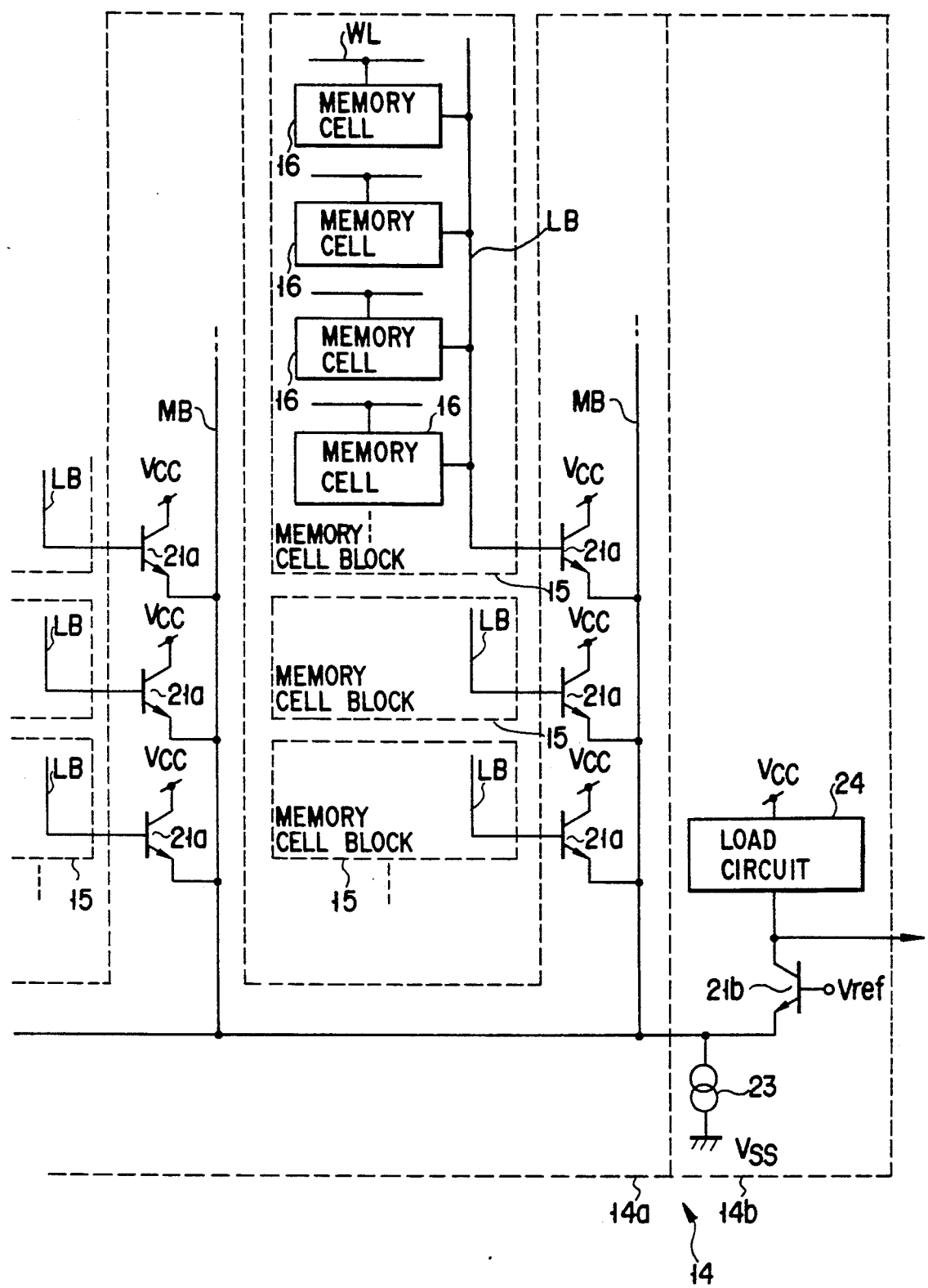
F I G. 2

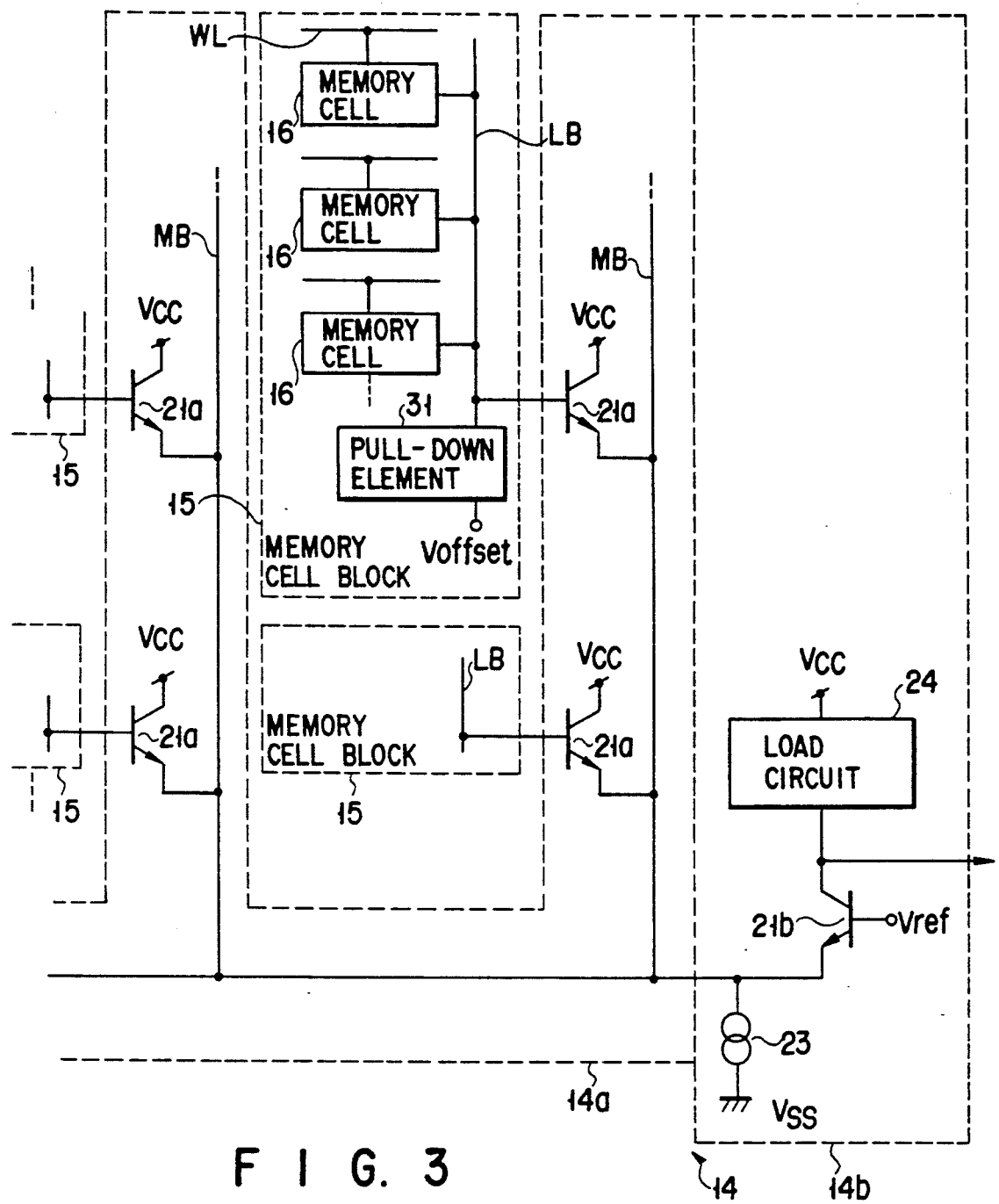
F I G. 3
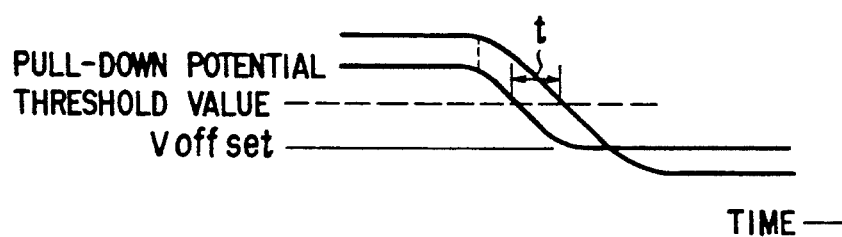
F I G. 4

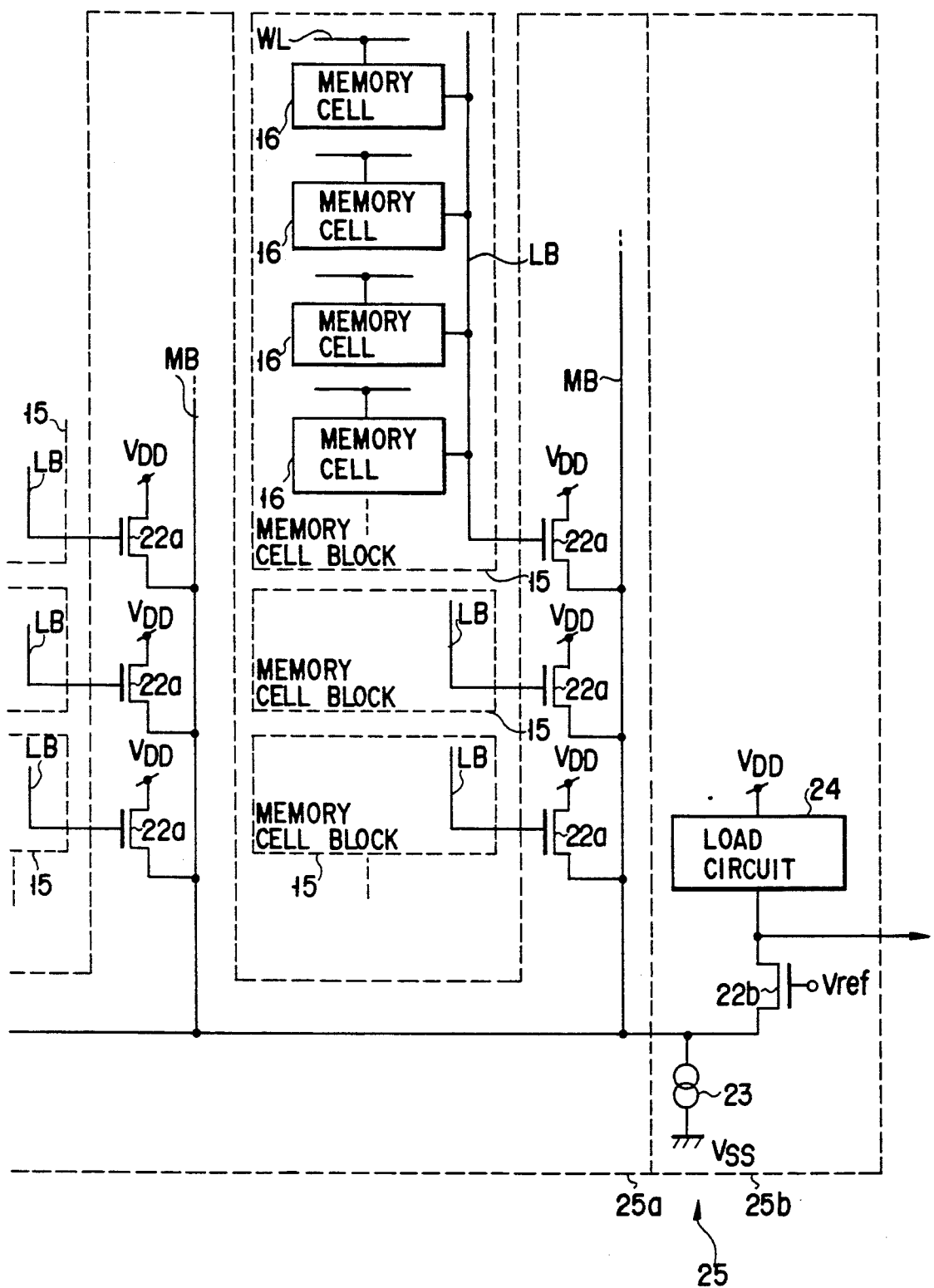
F I G. 5

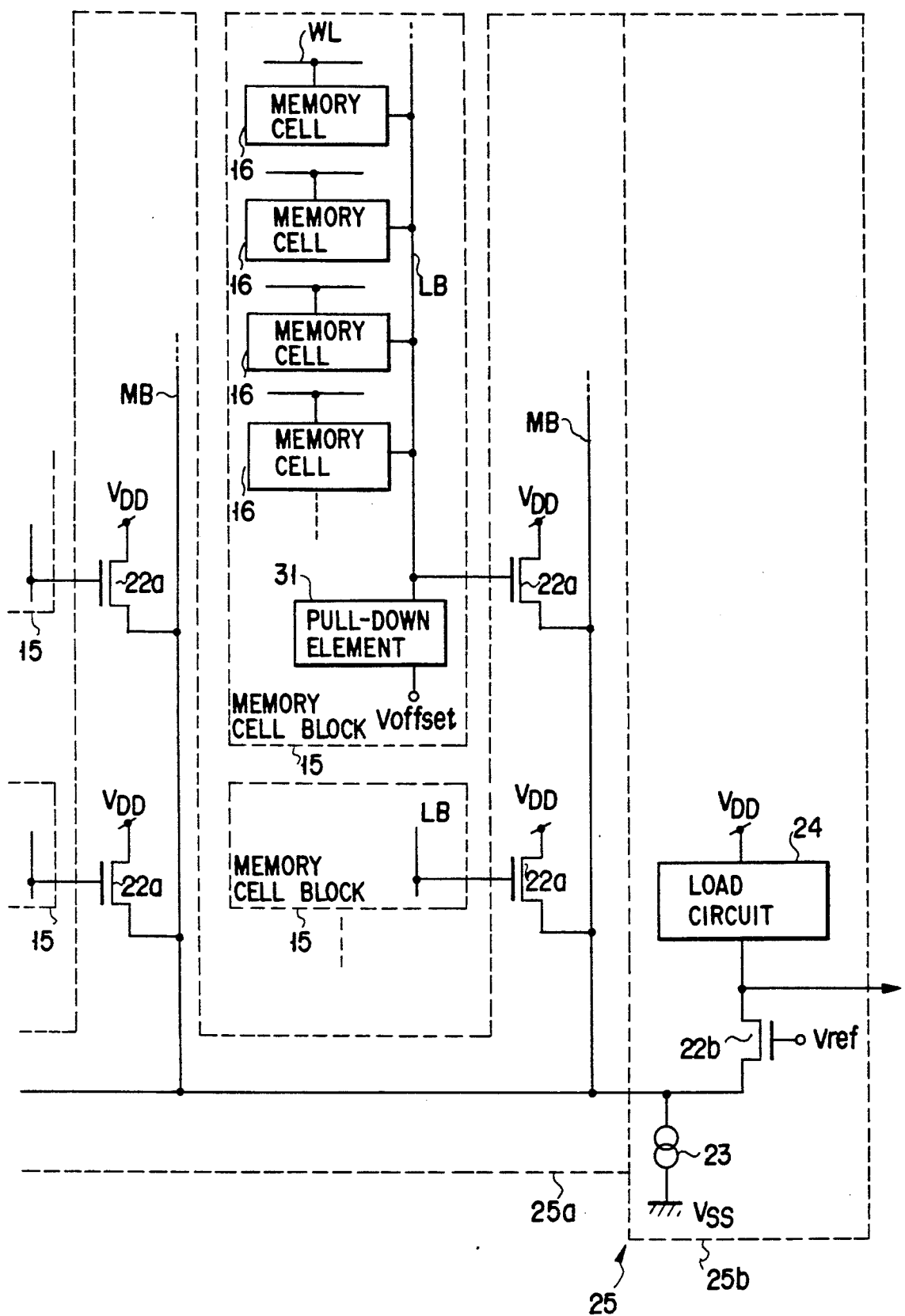
F I G. 6

SEMICONDUCTOR MEMORY DEVICE

BACKGROUND OF THE INVENTION

Field of the Invention

The present invention relates to a semiconductor memory device and, more particularly, to a bit line sense amplifier for a semiconductor memory circuit, which employs a divided bit line system.

Description of the Related Art

In general, a large-scale, large-capacity memory integrated circuit often employs a divided bit line system wherein bit lines to be connected to memory cell blocks are divided into local bit lines and main bit lines.

FIG. 1 is a partial block diagram of a CMOS memory circuit of a conventional dual bit line system. Reference numeral 51 denotes a memory circuit for one section on a memory chip; and 52, a bit line sense amplifier. In the 1-bit memory circuit 51, reference numeral 53 denotes column selectors for selecting read outputs on corresponding main bit lines MB of a plurality of columns in a memory cell array; and 54, a selector for selecting one memory circuit from several section. The output from each column selector 53 is input to the bit line sense amplifier 52. In each column, a memory cell array is divided into a plurality of memory cell blocks 55. In each memory cell block 55, reference numeral 56 denotes memory cell; WL, a word line commonly connected to the memory cells 56 in the same row; LB, a local bit line commonly connected to the memory cells in the same column; and 57, a memory cell block selector (buffer circuit) for selecting a read output of the local bit line BL. The output from the memory cell block selector 57 is input to the column selector 53.

Since the memory cell 56 has relatively small driving power, if the number of memory cells in the memory cell block 55 is large, the load capacitance (parasitic capacitance and wiring capacitance) driven by the memory cell 56 is increased, and the read speed is decreased. When the number of memory cells in the memory cell block 55 is decreased in order to decrease the load capacitance driven by the memory cell 56, the number of selectors passed until a signal read out from a memory cell 56 is transmitted to the bit line sense amplifier 52 is increased, and the read speed is also decreased.

SUMMARY OF THE INVENTION

The present invention has been made in consideration of the above situation, and has as its object to provide a semiconductor memory device of a divided bit line system, wherein one of each differential pair of a differential sense amplifier of a memory circuit is arranged in each block of a divided bit line, and outputs from the sense amplifiers are combined by emitter coupling, so that a main bit line having a heavy load is driven by the emitters having a high driving force, and outputs from the blocks can be sensed without going through selectors, thus allowing high-speed read access.

According to one aspect of the present invention, there is provided a semiconductor memory device comprising a plurality of memory cell blocks, each having a plurality of memory cells commonly connected to a local bit line, a predetermined number of memory cell blocks corresponding to each column, and a plurality of columns constituting a memory cell array, and a bit line sense amplifier for sense-amplifying outputs read out from the memory cells of said memory cell blocks, the bit line sense amplifier including a first portion consisting of a plurality of bipolar first transistors, base electrodes of which are connected to local bit lines of the plurality of memory blocks, emitter electrodes of which are connected to main bit lines of the corresponding columns, and collector electrodes of which are connected to a first power supply node, and a second portion consisting of a bipolar second transistor, which forms a differential pair with each of the plurality of first transistors, an emitter electrode of which is commonly connected to the main bit lines of the plurality of columns, and a base electrode of which is connected to a reference bias power supply, a current source connected between the emitter electrode of the second transistor and a second power supply node, and a load circuit connected between the collector electrode of said second transistor and the first power supply node.

According to another aspect of the present invention, there is provided a semiconductor memory device comprising a plurality of memory cell blocks, each having a plurality of memory cells commonly connected to a local bit line, a predetermined number of memory cell blocks corresponding to each column, and a plurality of columns constituting a memory cell array, and a bit line sense amplifier for sense-amplifying outputs read out from the memory cells of the memory cell blocks, the bit line sense amplifier including a first portion consisting of a plurality of MOS first transistors, gate electrodes of which are connected to local bit lines of the plurality of memory blocks, source electrodes of which are connected to main bit lines of the corresponding columns, and drain electrodes of which are connected to a first power supply node, and a second portion consisting of a MOS second transistor, which forms a differential pair with each of the plurality of first transistors, a source electrode of which is commonly connected to the main bit lines of the plurality of columns, and a gate electrode of which is connected to a reference bias power supply, a current source connected between the source electrode of the second transistor and a second power supply node, and a load circuit connected between the drain electrode of the second transistor and the first power supply node.

The differential bit line sense amplifier, which comprises the plurality of first transistors, the second transistor, the current source, and the load circuit, has a function of sense-amplifying read outputs from the memory cells of each memory cell block, and a function of directly combining the divided main bit lines. Therefore, since signals read out from the memory cells are directly input to the bit line sense amplifier without going through selectors, high-speed read access can be realized. In particular, when the differential bit line sense amplifier comprises bipolar transistors, the main bit line having a large wiring capacitance can be driven at high speed by the bipolar transistors having high driving performance, and read access at higher speed can be attained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a block diagram showing a ROM of a dual bit line system as a semiconductor memory device according to the first embodiment of the present invention;

FIG. 3 is a block diagram showing a ROM of a dual bit line system as a semiconductor memory device according to the second embodiment of the present invention;

FIG. 4 is a graph for explaining an operation of the second embodiment shown in FIG. 3;

FIG. 5 is a block diagram showing a ROM of a dual bit line system as a semiconductor memory device according to the third embodiment of the present invention; and FIG. 6 is a block diagram showing a ROM of a dual bit line system as a semiconductor memory device according to the fourth embodiment of the present invention.

DETAILED DESCRIPTION OF THE PREFERRED EMBODIMENTS

Figure 1:
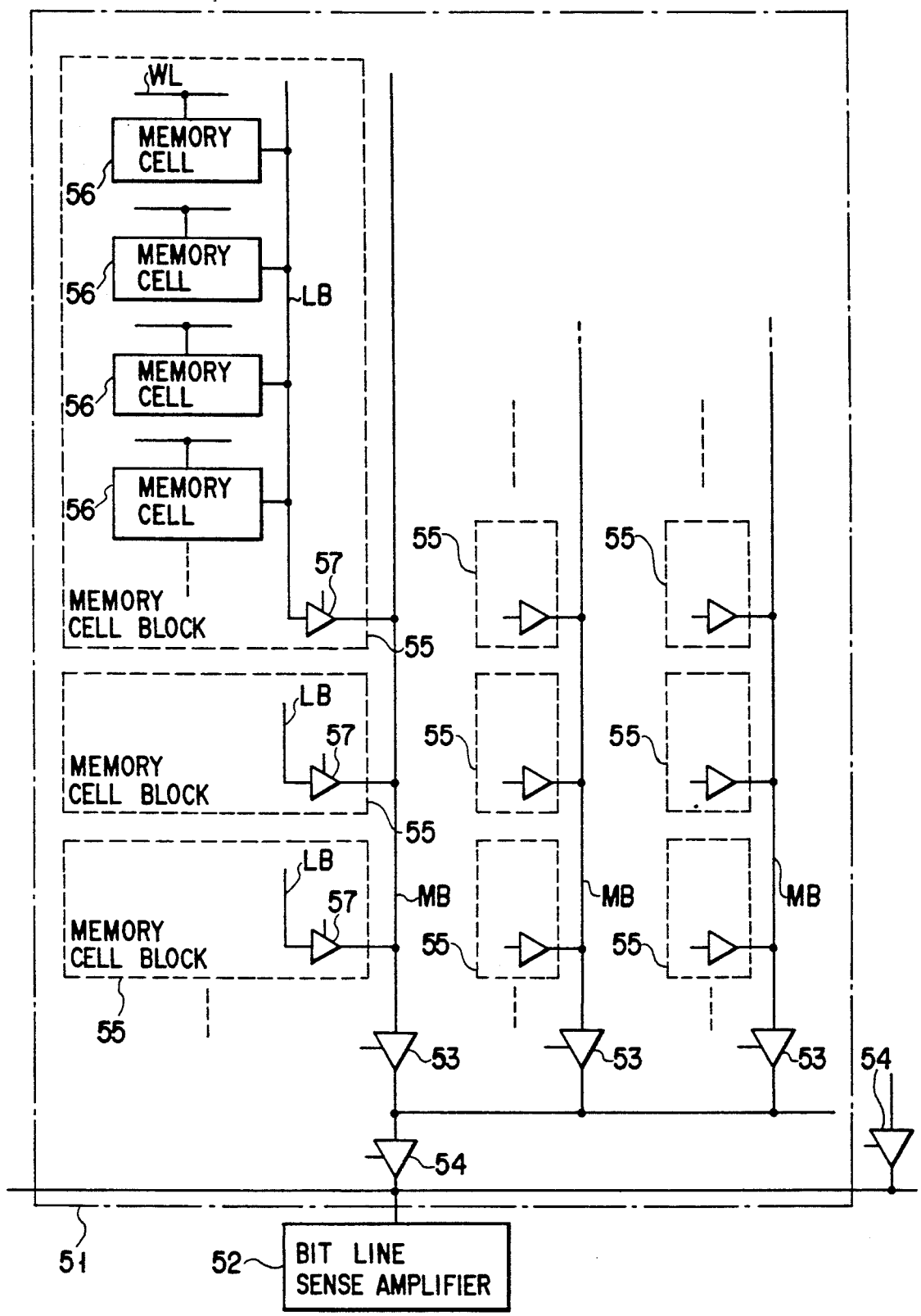
FIG. 1 is a partial block diagram of a CMOS memory circuit of a conventional dual bit line system.

The preferred embodiments of a semiconductor memory device according to the present invention will be described hereinafter with reference to the accompanying drawings.

FIG. 2 is a partial block diagram of a Bi (bipolar)-CMOS ROM (read-only memory) of a dual bit line system according to the first embodiment of the present invention. As compared to a conventional semiconductor memory circuit shown in FIG. 1, each of a plurality of columns in a memory cell array is divided into a plurality of memory cell blocks 15 like in the conventional circuit, while the memory cell block selectors 57, the column selectors 53, and the selector 54 are omitted, and a bipolar differential bit line sense amplifier 14 is added unlike in the conventional circuit. Each of a plurality of first NPN transistors 21a and a second NPN transistor 21b form a differential pair of the differential bit line sense amplifier.

The differential bit line sense amplifier 14 is constituted by first and second portions 14a and 14b. The first portion 14a comprises main bit lines MB, and the plurality of first NPN transistors 21a, the base electrodes of which are connected to local bit lines (output lines) LB commonly connected to a plurality of memory cells 16 in the respective memory cell blocks 15, the emitter electrodes of which are commonly connected to the main bit lines MB of the corresponding columns, and the collector electrodes of which are connected to a first power supply node (in this embodiment, a power supply potential $V_{CC}$). The second portion 14b comprises the second NPN transistor 21b, the emitter electrode of which is commonly connected to the main bit lines MB of the plurality of columns, and the base electrode of which is applied with a reference bias potential $V_{ref}$, a current source 23 commonly connected between the emitter electrode of the second NPN transistor 21b, and a second power supply node (in this embodiment, a ground potential $V_{SS}$), and a load circuit 24 connected between the collector electrode of the second NPN transistor 21b and the first power supply node.

The number of memory cells in each memory cell block 15 is determined according to the driving power of the memory cells 16, the wiring capacitance of the local bit lines LB, the scale of the overall ROM, and the like.

In the ROM of the first embodiment, the differential bit line sense amplifier 14 is constituted by the plurality of first NPN transistors 21a connected to the main bit lines MB, the second NPN transistor 21b, the current source 23, and the load circuit 24. When a word line WL corresponding to a given memory cell 16 in a given memory cell block 15 is selected, the potential of the local bit line of the given memory cell block 15 changes in response to a read signal from the given memory cell 16. This change is input to the first NPN transistor 21a whose base is connected to the local bit line LB, and is sense-amplified. More specifically, when the potential of the local bit line LB changes from "L" to "H" in response to a read signal from the given memory cell 16, the first NPN transistor 21a whose base is connected to this local bit line LB changes from an OFF state to an ON state, and the second NPN transistor 21b changes from an ON state to an OFF state. For this reason, a current from the current source 23 flows through the selected first NPN transistor 21a, and the collector output from the second NPN transistor 21b changes from "L" to "H".

According to the ROM of the first embodiment, the first portion 14a of the differential bit line sense amplifier 14 has a block selector function and a column selector function since read signals from the plurality of memory cell blocks 15 are input to the corresponding first NPN transistors 21a, each of which is one transistor of the differential pair transistors. For this reason, the block selectors (57 in FIG. 1), the column selectors (53 in FIG. 1), and the selector 54 required in the conventional semiconductor memory circuit can be omitted. Therefore, since the read signals from the memory cells are directly input to the second portion 14b of the bit line sense amplifier 14 without going through selectors, high-speed read access can be realized.

In addition, the load capacitance driven by each memory cell 16 can be decreased since it is limited to the wiring capacitance of the local bit line LB of the corresponding memory cell block 15, and the parasitic capacitances of other memory cells 16 connected to the local bit line LB (when a MOS transistor is connected to the local bit line LB, the drain capacitance of the transistor). Since the main bit lines LB having a large wiring capacitance can be driven at high speed by the bipolar transistors 21a having high driving performance, read access at higher speed can be attained.

FIG. 3 is a partial block diagram showing a ROM of a dual bit line system according to the second embodiment of the present invention. In the second embodiment, a pull-down element 31 is added between the local bit line LB of each memory cell block 15 and an offset power supply node in the arrangement of the first embodiment. Since other arrangements in FIG. 3 are the same as those in FIG. 2, they are denoted by the same reference numerals as in FIG. 2. In this circuit, as shown in FIG. 4, the output amplitude of the local bit line LB is suppressed between a pull-down potential determined by pulling between the memory cell 16 and the pull-down element 31, and an offset potential $V_{offset}$. For this reason, a time required for read access can be shortened by a time t as compared to a normal read time, and read access can be performed at higher speed.

In the first and second embodiments, the NPN transistors are used as the differential pair transistors of the differential bit line sense amplifier 14. However, PNP transistors may be used in place of the NPN transistors. In this case, the relationship of the power supply potentials is reversed in FIGS. 2 and 3, and the current source is arranged at the high-potential side. Furthermore, in the circuit shown in FIG. 3, a pull-up element must be connected at the high-potential source side in place of the pull-down element 31.

FIG. 5 is a partial block diagram showing a ROM of a dual bit line system according to the third embodiment of the present invention. In the third embodiment, a MOS differential bit line sense amplifier 25 is used. More specifically, in the first embodiment shown in FIG. 2, the plurality of first transistors 21a and the second transistor 21b comprise NPN bipolar transistors. However, in the third embodiment, first NMOS transistors 22a are used in place of the first transistors 21a, and a second NMOS transistor 22b is used in place of the second transistor 21b. Other arrangements are the same as those in the first embodiment, and a detailed description thereof will be omitted.

FIG. 6 is a partial block diagram showing a ROM of a dual bit line system according to the fourth embodiment of the present invention. In the fourth embodiment, a pull-down element 31 is connected between the local bit line LB of each memory cell block 15 and an offset power supply node like in the second embodiment described above. Since other arrangements are the same as those in FIG. 5, they are denoted by the same reference numerals as in FIG. 5. The operation of the fourth embodiment is the same as that in the second embodiment, and high-speed read access can be realized.

In the third and fourth embodiments, the differential pair transistors of the differential bit line sense amplifier 25 comprise NMOS transistors. However, in place of the NMOS transistors, PMOS transistors may be used. In this case, as described above, the relationship of the power supply potentials is reversed in FIGS. 5 and 6, and the current source is arranged at the high-potential side. Furthermore, in the circuit shown in FIG. 6, a pull-up element must be connected at the high-potential source side in place of the pull-down element 31.

In the above description, the present invention has been exemplified using ROMs. However, the present invention is not limited to the ROMs exemplified in the above embodiments, but may be applied to various other types of semiconductor memories such as SRAMs (static random-access memories), multi-port memories, and the like.

Additional advantages and modification will readily occur to those skilled in the art. Therefore, the invention in its broader aspects is not limited to the specific details, and representative devices, shown and described herein. Accordingly, various modifications may be made without departing from the spirit or scope of the general inventive concept a defined by the appended claims and their equivalents.

What is claimed is:

1. A semiconductor memory device comprising:
   a plurality of memory cell blocks, each having a plurality of memory cells commonly connected to a local bit line, a predetermined number of memory cell blocks corresponding to each column, and a plurality of columns constituting a memory cell array; and
   a bit line sense amplifier for sense-amplifying outputs read out from the memory cells of said memory cell blocks,
   said bit line sense amplifier including:
   a first portion consisting of a plurality of bipolar first transistors, base electrodes of which are connected to local bit lines of said plurality of memory blocks, emitter electrodes of which are connected to main bit lines of the corresponding columns, and collector electrodes of which are connected to a first power supply node; and
   a second portion consisting of a bipolar second transistor, which forms a differential pair with each of said plurality of first transistors, an emitter electrode of which is commonly connected to the main bit lines of the plurality of columns, and a base electrode of which is connected to a reference bias power supply, a current source connected between the emitter electrode of said second transistor and a second power supply node, and a load circuit connected between the collector electrode of said second transistor and the first power supply node.

2. A device according to claim 1, further comprising potential pull-down means between the local bit line of each of said plurality of memory cell blocks and a third power supply node offset from said second power supply node.

3. A device according to claim 1, further comprising potential pull-up means between the local bit line of each of said plurality of memory cell blocks and a third power supply node offset from said first power supply node.

4. A device according to claim 1, wherein said plurality of first transistors and said second transistor comprise NPN bipolar transistors.

5. A device according to claim 1, wherein said plurality of first transistors and said second transistor comprise PNP bipolar transistors.

6. A semiconductor memory device comprising:
   a plurality of memory cell blocks, each having a plurality of memory cells commonly connected to a local bit line, a predetermined number of memory cell blocks corresponding to each column, and a plurality of columns constituting a memory cell array; and
   a bit line sense amplifier for sense-amplifying outputs read out from the memory cells of said memory cell blocks,
   said bit line sense amplifier including:
   a first portion consisting of a plurality of MOS first transistors, gate electrodes of which are connected to local bit lines of said plurality of memory blocks, source electrodes of which are connected to main bit lines of the corresponding columns, and drain electrodes of which are connected to a first power supply node; and
   a second portion consisting of a MOS second transistor, which forms a differential pair with each of said plurality of first transistors, a source electrode of which is commonly connected to the main bit lines of the plurality of columns, and a gate electrode of which is connected to a reference bias power supply, a current source connected between the source electrode of said second transistor and a second power supply node, and a load circuit connected between the drain electrode of said second transistor and the first power supply node.

7. A device according to claim 6, further comprising potential pull-down means between the local bit line of each of said plurality of memory cell blocks and a third power supply node offset from said second power supply node.

8. A device according to claim 6, further comprising potential pull-up means between the local bit line of each of said plurality of memory cell blocks and a third power supply node offset from said first power supply node.

9. A device according to claim 6, wherein said plurality of first transistors and said second transistor comprise NMOS type MOS transistors.

10. A device according to claim 6, wherein said plurality of first transistors and said second transistor comprise PMOS type MOS transistors.

* * * * *